United States Patent [19]

Dütting et al.

[11] Patent Number: 5,319,667
[45] Date of Patent: Jun. 7, 1994

[54] TUNABLE SEMICONDUCTOR LASER

[75] Inventors: Kaspar Dütting; Olaf Hildebrand, both of Stuttgart; Dieter Baums, Ludwigsburg; Wilfried Idler, Markgröningen; Michael Schilling, Stuttgart; Klaus Wünstel, Schwieberdingen, all of Fed. Rep. of Germany

[73] Assignee: Alcatel N.V., Amsterdam, Netherlands

[21] Appl. No.: 35,918

[22] Filed: Mar. 22, 1993

[30] Foreign Application Priority Data

Apr. 10, 1992 [DE] Fed. Rep. of Germany ....... 4212152

[51] Int. Cl.$^5$ ............................................. H01S 3/082
[52] U.S. Cl. ..................... 372/97; 372/102; 385/130
[58] Field of Search ................... 372/45, 46, 50, 97, 372/98, 99, 102; 385/2, 4, 8, 130

[56] References Cited

U.S. PATENT DOCUMENTS

| 4,578,791 | 3/1986 | Chen | 372/50 |
|---|---|---|---|
| 4,809,288 | 2/1989 | Welch et al. | 372/46 |
| 4,933,301 | 6/1990 | Scifres et al. | 437/129 |
| 4,977,570 | 12/1990 | Hasegawa | 372/50 |
| 5,105,433 | 4/1992 | Eisele et al. | 372/98 |

FOREIGN PATENT DOCUMENTS

| 0083980 | 7/1983 | European Pat. Off. . |
|---|---|---|
| 0162660 | 11/1985 | European Pat. Off. . |
| 0418705 | 3/1991 | European Pat. Off. . |
| 0516044 | 12/1992 | European Pat. Off. . |
| 3931588 | 4/1991 | Fed. Rep. of Germany . |
| 62-124791 | 6/1987 | Japan . |
| 62-272579 | 11/1987 | Japan . |
| 84/03399 | 8/1984 | PCT Int'l Appl. . |

OTHER PUBLICATIONS

Schilling et al., "Integrated Interferometric Injection Laser: Novel Fast and Broad–Band Tunable Monolithic Light Source, IEEE Journal of Quantum Electronics," vol. 27, No. 6, Jun. 1991, pp. 1616–1622.

Lee, "Recent Advances in Long-Wavelength Semiconductor Lasers for Optical Fiber Communication," Proceedings of the IEEE, vol. 79, No. 3, Mar. 1991, pp. 253–276.

Schilling et al., "Widely Tunable Y-Coupled Cavity Integrated Interferometric Injection Laser," Electronics Letters, vol. 26, No. 4, Feb. 1990, pp. 243–244.

Wulf-Mathies, "Integrated Optics for Fiberoptical Sensors," Laser und Optoelektronik, Feb. 1989, pp. 57–63.

H. A. Fattah et al, "Semiconductor Interferometric Laser," Applied Physics Letters, vol. 41, No. 2, Jul. 15, 1982, pp. 112 to 114 vol. 27, No. 6, Jun. 1991, pp. 1616–1622.

H. A. Fattah et al., "Electrical Tuning of Semiconductor Interferometric Laser," Electronics Letters, vol. 19, No. 22, Oct. 27, 1983 pp. 926 and 927.

Primary Examiner—Rodney B. Bovernick
Assistant Examiner—Robert E. Wise
Attorney, Agent, or Firm—Spencer, Frank & Schneider

[57] ABSTRACT

An interferometric semiconductor laser includes a cavity in the form of a Y and at east three individually actuatable active segments. A central segment couples together the individually actuatable active segments. The central segment is an active or passive segment that acts as a beam divider. The arrangement of the segments forms two resonator paths which contain at least one common active segment. At least one resonator path includes an active segment that does not belong to the other resonator path. In the absence of, or with the same actuation of the active segments, the optical path length of one resonator path differs from the optical path length of the other resonator path.

16 Claims, 3 Drawing Sheets

TUNABLE SEMICONDUCTOR LASER

CROSS REFERENCE TO RELATED APPLICATION

This application claims the priority of Application Ser. No. P 42 12 152.3, filed Apr. 10th, 1992, in the Federal Republic of Germany, the subject matter of which is incorporated herein by reference.

BACKGROUND OF THE INVENTION

Field of the Invention

The invention relates to an interferometric semiconductor laser including a cavity in the form of a Y and comprising at least three individually actuatable active segments which are coupled together by way of an active or passive central segment that acts as a beam divider, the arrangement of the segments being such that two resonator paths are formed which contain at least one common active segment and of which at least one includes an active segment that does not belong to the other resonator path.

Background Information

Such a laser is disclosed, for example, in an article by M. Schilling et al, entitled, "Integrated Interferometric Injection Laser: Novel Fast and Broad-Band Tunable Monolithic Light Source", in IEEE Journal of Quantum Electronics, Volume 27, No. 6, June, 1991, pages 1616–1622. Because of its typical form, in its simplest configuration, similar to a Y, it is also called a Y laser, more precisely a YCC-$I^3$ laser. Such a laser has two coupled together resonator paths which, starting at the end face of the root of the Y, extend to the mirror end faces of the two arms of the Y. In both resonators, Fabry-Perot modes are able to form which, since their wavelength is usually short compared to the resonator length, lie very close together. Which modes begin to oscillate depends, on the gain characteristics of the laser material of the active segments and, on the current supplied to the active segments of the resonators. By way of a change in the refraction index in the segments influenced by the current, this current causes a shift in the wavelengths of the Fabry-Perot modes in the resonators. A change in the current in a common active segment produces a shift in all resonators containing this segment; a change in the current in an active segment belonging to only one resonator causes a shift in the wavelength of the Fabry-Perot modes of this resonator relative to the wavelengths of the Fabry-Perot modes of the other resonators.

The selection of an individual Fabry-Perot mode of a given wavelength with sufficient side mode suppression is difficult, because the use of the flat gain characteristic of the laser material for mode selection causes the lead in the gain of one Fabry-Perot mode compared to the closely adjacent side modes to be small and the selection of one mode from its adjacent modes therefore requires the accurate superposition of the gain characteristic maxima of all active segments. The selection is also difficult because, with utilization of the above-described shift in the Fabry-Perot mode crests of two coupled together resonators (so-called supermode selection), the smallest changes in current are able to cause great changes in wavelength which makes the system difficult to control. Tuning a laser as described in the above-mentioned article is therefore generally not possible according to a simple scheme but requires very accurate, different settings of the various currents in the active segments for each wavelength. These current settings must be determined experimentally and must be stored.

SUMMARY OF THE INVENTION

It is the object of the invention to provide a semiconductor laser of the above-described type which is improved with respect to a controllable wavelength setting, with respect to the number of currents that must be changed for tuning and with respect to the tolerances required when changing these currents.

This is accomplished in an interferometric semiconductor laser including a cavity in the form of a Y and comprising at least three individually actuatable active segments which are coupled together by way of an active or passive central segment that acts as a beam divider, with the arrangement of the segments being such that two resonator paths are formed which contain at least one common active segment and of which at least one includes an active segment that does not belong to the other resonator path, in that, in the absence of or with the same actuation of the active segments, the optical path length of the one resonator path differs from the optical path length of the other resonator path.

Due to the greatly differing optical lengths of two coupled together resonators, an interferometric system develops within the semiconductor laser which has the characteristics of a Mach-Zehnder filter as known, for example, for the examination of line width and noise in multi-mode lasers.

The Mach-Zehnder filter here modulates the flat gain characteristic of the laser material in such a manner that more intensely curved regions are created within which adjacent Fabry-Perot modes exhibit greater differences in gain and can thus be more easily selected individually. The position on the wavelength axis of the gain maxima created by the Mach-Zehnder filter action can here be set significantly more precisely and easily than that of the maximum of several superposed gain characteristics of the individual segments.

By using the Mach-Zehnder gain maxima as an additional selection means it becomes possible to produce semiconductor lasers for quite specifically defined applications and to set them according to the specifics of the application.

Thus, by appropriately selecting the difference between the optical path lengths of two resonators, the wavelength spacing between adjacent Mach-Zehnder gain maxima and thus also their curvature can be pre-set during manufacture of the laser.

A precise final setting can be effected by varying the currents of the common segments, or of segments belonging to different resonators.

Further embodiments of the semiconductor laser according to the invention are described in the detailed description. For example, one embodiment provides for different geometric lengths of the non-common segments of two resonator paths for the production of a difference between the optical path lengths, while another embodiment accomplishes this by the use of materials having different optical characteristics in the non-common segments.

Still another embodiment relates to the arrangement of the entire laser on a single monolithic substrate. This permits the advantageous realization of different forms of segment arrangements, with individual segments, for example, the central segment (2), possibly having active and passive portions.

A modification of the invention in yet another embodiment provides as the central segment a discretely configured optical beam divider lens system, while a further modification provides for an optical fiber coupling arrangement. Thus, the coupled-together active segments can be produced on various, possibly different, substrates independently of one another.

Other embodiments relate to various possible operating modes of the semiconductor laser according to the invention.

According to one such embodiment the ratio of the currents is varied in segments belonging to two different resonators. Thus, the position of a Mach-Zehnder gain maximum generated by interference of the light generated in two resonators having different optical path lengths—which corresponds to the minimum of a Mach-Zehnder loss characteristic—can be set on the wavelength axis and in this way, a single Fabry-Perot mode from a series of mutually adjacent Fabry-Perot modes can be caused to oscillate.

Another embodiment relates to a particularly simple and efficient manner of actuating the laser. By keeping the total laser current constant, the position of the gain maximum of the laser material and the wavelengths of possible Fabry-Perot modes do not change significantly and, for a selection of individual Fabry-Perot modes, the absolute Mach-Zehnder gain maximum can be pushed beyond the Fabry-Perot mode crest. The current ratio can be set, for example, by means of a potentiometer whose ground terminals are connected with the laser segments and whose tap is connected with a constant current source.

An operating mode disclosed in another embodiment permits pushing the laser material gain characteristic over the wavelength axis and thus, by way of the selection of different Mach-Zehnder gain maxima, permits the selection of certain wavelength ranges. Thus, according to a further embodiment, it is possible, at the end of an initially selected wavelength range, to switch to an adjacent wavelength range and thus to considerably broaden the tuning range of the laser. The actuation of the laser remains simple. In the same manner, while keeping the ratio of the currents flowing in segments belonging to different resonators constant, given Fabry-Perot modes lying in the centers of various Mach-Zehnder gain maxima can be selected with great current tolerance simply by varying the total current flowing through one, or several, common segments. A laser according to the invention operated in this manner is particularly suitable for optical channel switching in communications applications.

With a configuration according to yet another embodiment, individual Fabry-Perot modes can be selected with particularly good side mode suppression.

BRIEF DESCRIPTION OF THE DRAWINGS

Embodiments of the semiconductor laser according to the invention will now be described in detail with reference to several drawing figures and the operating mode of the semiconductor laser will be explained.

DETAILED DESCRIPTION OF THE PREFERRED EMBODIMENTS

Figure 1:
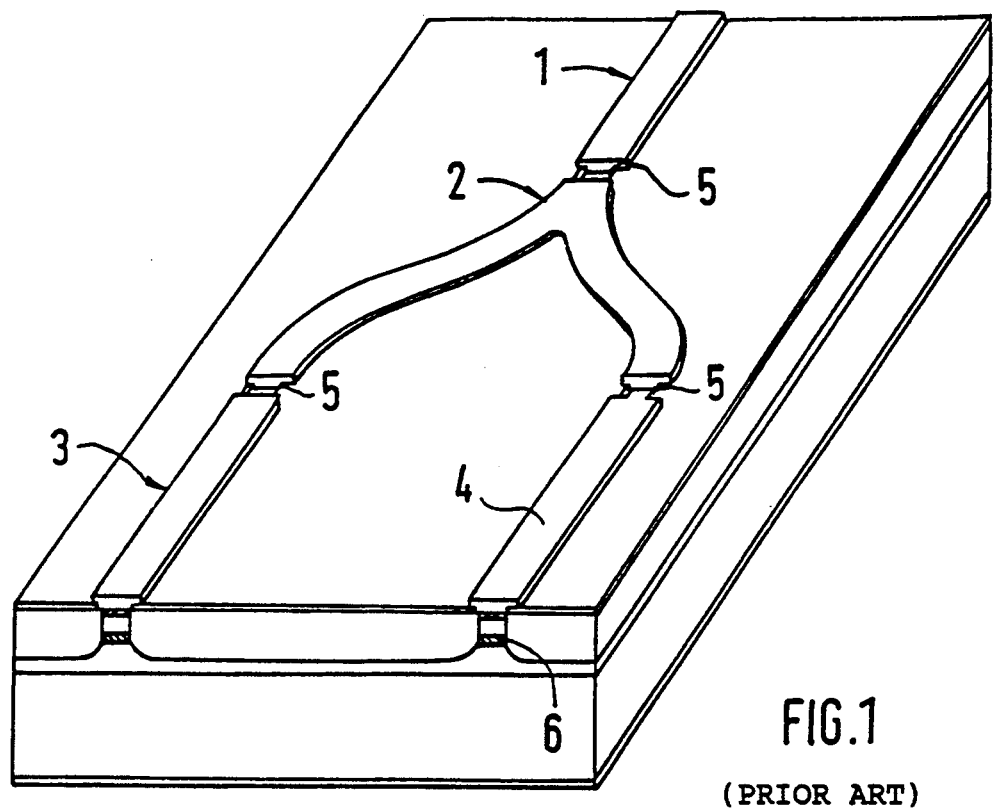
FIG. 1 depicts a so-called Y laser according to the prior art.

FIG. 1 depicts a monolithically constructed Y laser according to the prior art. The vertical layer structure of this laser is identical along the entire Y-shaped structure of the laser cavity and may correspond, for example, to the configuration shown and described in the above-mentioned article, in FIG. 1 and in the associated description. A laser active layer 6 extends without interruption along the entire Y-shaped structure whose surface is covered by a metal layer. This metal layer is electrically separated at certain locations 5. The mutually separated components of the metal layer determine the lengths of a total of four individually actuatable laser segments 1 to 4. In the illustrated Y laser, essentially two resonators are formed each extending from the reflecting end face at the root of the Y-shaped structure, to the likewise reflecting end face of one of the arms. To a lesser extent, a so-called gusset mode is also able to form in a portion of the Y structure extending from the root to the branching point. Thus, root segment 1 and segment 2, which includes the beam divider, can be considered to be common segments of both resonator paths. The remaining segments 3 and 4 each influence one of the resonators. Current is supplied to the segments by way of direct contacting of the metal layer which is not shown in the drawing figure.

Figure 2:
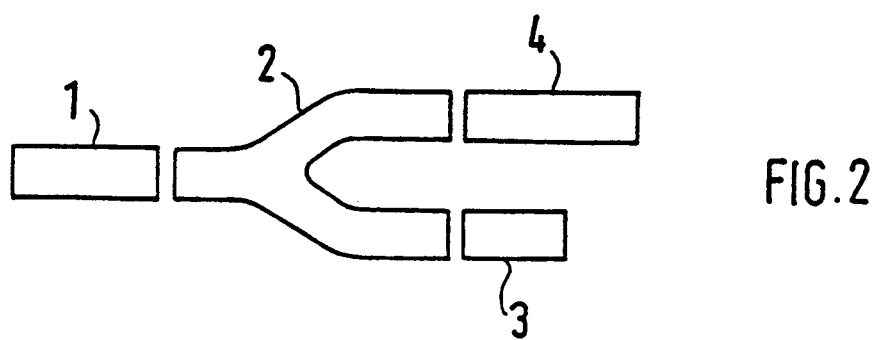
FIG. 2 depicts the arrangement of the segments in a Y laser according to the invention.

FIG. 2 is a schematic representation of the arrangement of the segments in a semiconductor laser according to the invention. Here segment 3 is significantly shorter than segment 4. This leads to greatly differing lengths of the coupled-together resonators. Therefore, the illustrated laser behaves like a Mach-Zehnder filter and modulates the flat gain characteristic of the laser material with a succession of Mach-Zehnder gain characteristics that are curved much more sharply than the former.

Figure 3:
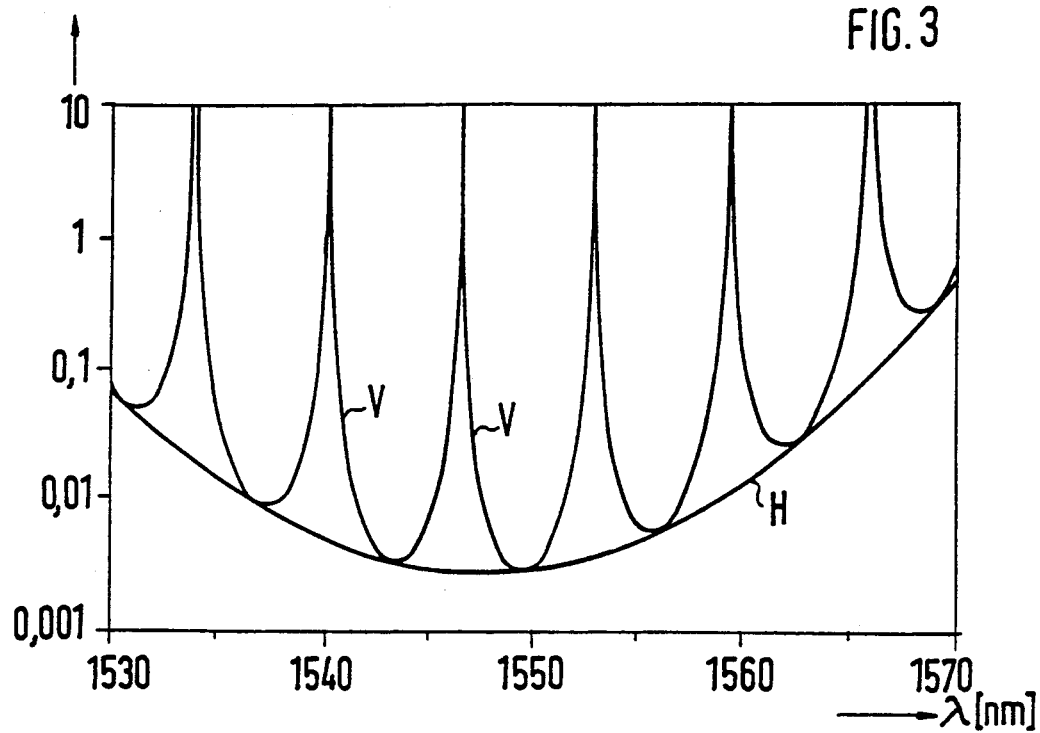
FIG. 3 depicts a sequence of Mach-Zehnder loss characteristics for segments of various lengths associated with different resonator paths.

FIG. 3 shows loss characteristics V corresponding to the mentioned gain characteristics in a semiconductor laser according to the invention equipped with different resonators. Here the loss is plotted over the wavelength for a given fixed difference in resonator length. If the segment currents are increased beyond a minimum value required for laser operation, Fabry-Perot modes will begin to oscillate whose wavelengths lie at locations at which the losses are lowest (the gain is highest). Since the Mach-Zehnder loss characteristics are curved significantly more strongly in the region of their minima than their envelope H, the loss characteristic of the laser material, a significantly higher selectivity exists in the selection of individual Fabry-Perot modes and a much better side mode suppression is possible than would be permitted by the flat loss characteristic of the laser material.

To select a Fabry-Perot mode, for example, the ratio of the currents in the two non-common segments of the two interfering resonator paths is varied. To prevent a shift of the loss characteristic of the laser material, the envelope of the Mach-Zehnder loss characteristics, the total current is here kept constant. Thus the minima of the Mach-Zehnder loss characteristics V shift in their wavelengths along the envelope H and that Fabry-Perot mode begins to oscillate which lies in the region of the lowest minimum of all Mach-Zehnder loss characteristics. Due to the values of the Mach-Zehnder loss characteristic rising steeply on both sides of their minima, closely adjacent Fabry-Perot modes are unable to begin oscillating simultaneously. A Fabry-Perot mode in the region of the next Mach-Zehnder loss characteristic begins to oscillate only if the loss characteristic V previously employed for mode selection has been shifted along the envelope curve H toward higher loss values to such an extent that the minimum of the next Mach-Zehnder loss characteristic comes to lie lower than that of the previously employed loss characteristic and, therefore, exhibits a smaller loss. This causes a Fabry-Perot mode with a greatly different wavelength to begin in the region of this next Mach-Zehnder loss characteristic. In any case, the selection of individual, adjacent Fabry-Perot modes can be effected, with good side mode suppression, merely by a change in the ratio of the currents flowing in segments belonging to different resonators, in a wavelength range which corresponds to the distance between two Mach-Zehnder loss minima.

Since the distance between the Mach-Zehnder loss minima is determined by the difference in resonator lengths and can thus be selected almost at will, the tuning range can be selected to be narrower or broader, and can thus be adapted to desired operating conditions. The width of the setting of the tuning range depends on the spacing of the Fabry-Perot modes and on the required effective side mode suppression, which, if only the above-mentioned current ratio is varied but the total current is kept constant, worsens with increasing width of the tuning range.

However, there is a possibility of broadening the tuning range without having to accept a less effective side mode suppression. This is accomplished by a change in the total current of all laser segments while maintaining the set, above-mentioned current ratio. A change in total current, which is most easily realized by a change in the current in a laser segment belonging jointly to both resonators, shifts the wavelength of the loss characteristic of the laser material, that is, the envelope curve H of the Mach-Zehnder loss characteristics. If now the envelope curve is also shifted by changing the total current together with the Mach-Zehnder loss characteristic employed for mode shifted by a change in the above-mentioned current ratio, the tuning range can be broadened significantly with side mode suppression remaining good.

Figure 4:
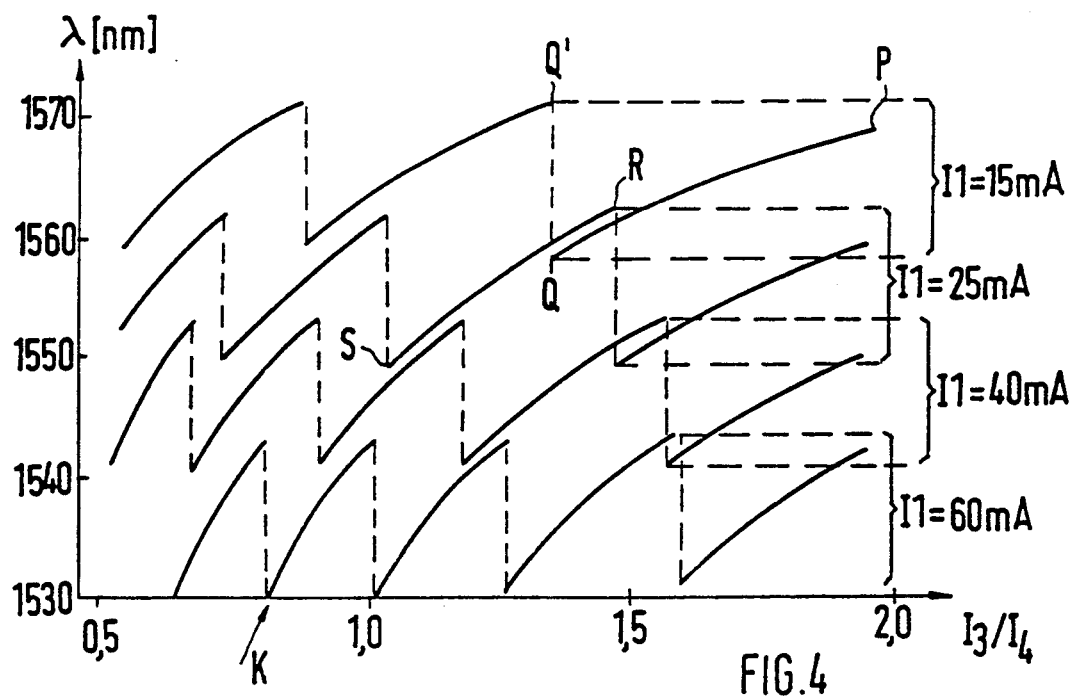
FIG. 4 depicts tuning ranges of the semiconductor laser according to the invention.

FIG. 4 reflects the result of such a laser actuation. This figure shows the wavelengths of possible Fabry-Perot modes as a function of the ratio of I3/I4 of the currents that do not traverse common segments of two resonators for various values of the total current $\Sigma I1$ to I4.

Each continuous curve train (e.g. partial curve section PQ or RS) forms a tuning range that can be set solely with the aid of the ratio of the currents in the non-common segments of two resonators. If the total current remains the same, the wavelength of the selected Fabry-Perot mode at the ends of such a partial curve section (e.g. PQ) jumps to a value that is offset against one another by the distance between two Mach-Zehnder loss minima (e.g., from point Q to point Q'). If, however, a switch is first made by changing the total current to another total current range (here I1=25 mA), the curve changes to a partial curve section RS that continues almost without interruption. The tuning range is thus broadened by the width of this curve section. By further switching the total current (here to 40 mA or 60 mA, respectively), further partial curve sections can be added smoothly so that the curve marked K in the figure results as the total tuning range. Thus, if the geometric configuration of the laser segments is unchanged, the individual curve sections of curve K constitute defined wavelength ranges between which a switch can be made by selection of associated discrete total current values.

In principle, it is possible by changing the current through a segment belonging to only one resonator, to change the current ratio as well as the total current simultaneously. However, it should be possible only in rare cases to adapt these changes to one another in such a way that desired modes begin to oscillate in the region of an adjacent curve section.

However, it is possible to adapt the changes of current ratio and total current to one another without problems by actuating two segments, of which one influences only the total current.

A particularly sensitive selection of individual Fabry-Perot modes with extraordinarily good side mode suppression is realized if the distance between Mach-Zehnder loss minima is set to be only slightly different from the distance between the Fabry-Perot modes. Then, a slight change in the distance between the Mach-Zehnder loss minima permits different Fabry-Perot modes to be brought into coincidence with the Mach-Zehnder loss characteristics. These Fabry-Perot modes that coincide with the Mach-Zehnder loss minima are further removed from one another than immediately adjacent Fabry-Perot modes and are consequently easily selected by displacing the loss characteristic of the laser material by changing the total laser current.

Figure 5:
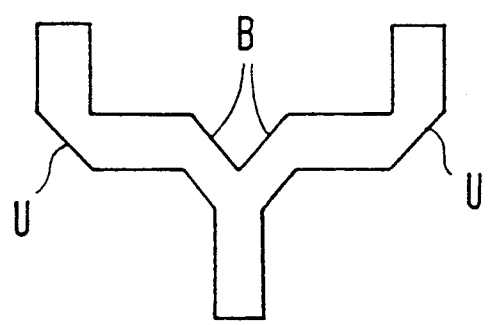
FIG. 5 depicts a central segment constructed by employing a biprism and beam deflection mirrors.

FIG. 5 shows a central segment in which the beam is divided by a biprism B and in which curved segment portions are avoided by using beam deflection mirrors U.

It will be understood that the above description of the present invention is susceptible to various modifications, changes and adaptations, and the same are intended to be comprehended within the meaning and range of equivalents of the appended claims.

What is claimed is:

1. An interferometric semiconductor laser including a cavity in the form of a Y and comprising:
   at least three individually actuatable active segments; and
   a central segment coupling together the at least three individually actuatable active segments, the central segment being one of an active or passive segment that acts as a beam divider;
   wherein the arrangement of the segments forms two resonator paths which contain at least one common active segment;
   wherein at least one resonator path includes an active segment that does not belong to the other resonator path; and
   wherein, in the absence of or with the same actuation of the active segments, the optical path length of the one resonator path differs from the optical path length of the other resonator path.

2. An interferometric semiconductor laser according to claim 1, wherein the resonator paths have different geometrical lengths, and wherein the different optical path lengths of the resonator paths are due to the different geometrical lengths of the resonator paths.

3. An interferometric semiconductor laser according to claim 1, wherein the non-common active segments contained in the resonator paths, or active segments that influence them, are constructed of different materials having different optical characteristics; and wherein the different optical path lengths of the resonator paths are due to the use of materials having different optical characteristics for the construction of the non-common active segments contained in the resonator paths or the active segments that influence them.

4. An interferometric semiconductor laser according to claim 1, wherein the central segment and the active segments that are coupled with it are disposed on a single monolithic substrate.

5. An interferometric semiconductor laser according to claim 4, wherein the central segment comprises a beam divider and a linear segment portion.

6. An interferometric semiconductor laser according to claim 5, wherein the beam divider comprises a biprism and beam deflection mirrors, whereby curved segment portions are avoided.

7. An interferometric semiconductor laser according to claim 4, wherein the central segment comprises laser active components and passive components.

8. An interferometric semiconductor laser according to claim 1, wherein the central segment comprises a discretely constructed optical beam divider lens system.

9. An interferometric semiconductor laser according to claim 1, wherein the central segment comprises a passive optical fiber arrangement.

10. A method of operating a semiconductor laser according to claim 1, the method comprising:

flowing respective currents through at least two segments of the laser, of which one belongs to at least one resonator path exclusively; and varying a ratio between the currents whereby a desired position of the absolute minimum of one of the Mach-Zehnder loss characteristics associated with a resonator path is set on the wavelength axis, influenced by the different optical path lengths of the resonator paths which are influenced by the currents.

11. A method according to claim 10, further comprising keeping a total current constant while the ratio of the current is varied.

12. A method according to claim 10, further comprising generating an additional current flow by way of at least one segment that belongs jointly to both resonator paths.

13. A method according to claim 12, further comprising varying the current in steps in order to switch between wavelength ranges or between preselected wavelengths lying between these wavelength ranges, by way of the segment that belongs jointly to the two resonator paths.

14. A method according to claim 10, wherein the resonator path lengths are set so that a distance between the respective Mach-Zehnder loss minima is slightly different from the distance between the Fabry-Perot modes, and wherein selection of a desired Fabry-Perot mode is effected by producing coincidence between the minimum of a Mach-Zehnder loss characteristic and the minimum of the loss characteristic of the laser material at the wavelength of the desired Fabry-Perot mode, by varying the ratio of the currents by way of active segments that belong to interfering resonators, and/or by varying the total laser current.

15. A method according to claim 10, further comprising keeping the ratio of the currents constant while a total current is varied.

16. A method according to claim 10, further comprising simultaneously varying the ratio of the currents and varying a total current.

* * * * *